United States Patent [19]

Sacher et al.

[11] 4,161,276

[45] Jul. 17, 1979

[54] COMPLEX LOGICAL FAULT DETECTION APPARATUS AND METHOD

[75] Inventors: Eric Sacher, Phoenix, Ariz.; Thomas E. Trebelhorn, San Diego, Calif.

[73] Assignee: NCR Corporation, Dayton, Ohio

[21] Appl. No.: 882,518

[22] Filed: Mar. 1, 1978

[51] Int. Cl.$^2$ ............................................. G06F 11/00
[52] U.S. Cl. .................................. 235/302; 324/73 R
[58] Field of Search ............................. 235/302, 302.1; 324/73 R, 73 AT

[56] References Cited

U.S. PATENT DOCUMENTS

| | | | |
|---|---|---|---|
| 3,887,869 | 6/1975 | Connolly et al. | 324/73 R |
| 3,924,181 | 12/1975 | Alderson | 235/302 X |
| 3,976,864 | 8/1976 | Gordon et al. | 235/302 |
| 4,059,749 | 11/1977 | Feilchenfeld | 235/302 |

*Primary Examiner*—Jerry Smith

*Attorney, Agent, or Firm*—J. T. Cavender; Stephen F. Jewett; Edward Dugas

[57] ABSTRACT

The present invention relates to apparatus and method for testing logic circuit boards for complex logical faults contained therein. A known good identical logic circuit is stimulated by a preselected sequence of binary test patterns and the number of transitions in logical state before achieving a final logical state as well as the final logical state for a number of points within the circuit are monitored and saved. The logic circuit being tested is then stimulated by the same test pattern sequence and the number of transitions and final logical states achieved are compared. Failure to have identity between the known good logical circuit and the logical circuit being tested both as to number of transitions and final logical state achieved for the tested points indicates a malfunction within the board which would not be detected by mere sampling of the final output state alone.

8 Claims, 12 Drawing Figures

FIG. 2

|  | INPUT | TIME | OUTPUT |  |
|---|---|---|---|---|
|  | 0 | 0.0 | N |  |
|  | • | 11.30 | 0 |  |
| T1 → | > | 0.0 | 0 |  |
|  | 1 | 1.50 | • |  |
|  | • | 4.70 | > | ← C1 |
| T2 → | • | 6.20 | 1 |  |
|  | • | 6.40 | < | ← C2 |
|  | • | 7.90 | 0 |  |
|  | • | 11.30 | > | ← C3 |
| T3 → | • | 12.80 | 1 |  |
|  | • | 12.90 | < | ← C4 |
| T4 → | • | 14.40 | 0 |  |

NORMAL (a)

|  | INPUT | TIME | OUTPUT |  |
|---|---|---|---|---|
|  | 0 | 0.0 | N |  |
|  | • | 11.30 | 0 |  |
| T1 → | > | 0.0 | 0 |  |
|  | 1 | 1.50 | • |  |
|  | • | 4.70 | • |  |
| T2 → | • | 6.20 | • |  |
|  | • | 6.40 | • |  |
|  | • | 7.90 | • |  |
|  | • | 11.30 | > | ← C3 |
| T3 → | • | 12.80 | 1 |  |
|  | • | 12.90 | < | ← C4 |
| T4 → | • | 14.40 | 0 |  |

S-A-0 FAULT AT NODE "I"

(b)

- N = UNINITIALIZED
- 0 = LOGIC 0 (F)
- 1 = LOGIC 1 (T)
- \> = EDGE POSITIVE
- < = EDGE NEGATIVE
- • = UNCHANGED FROM PREVIOUS

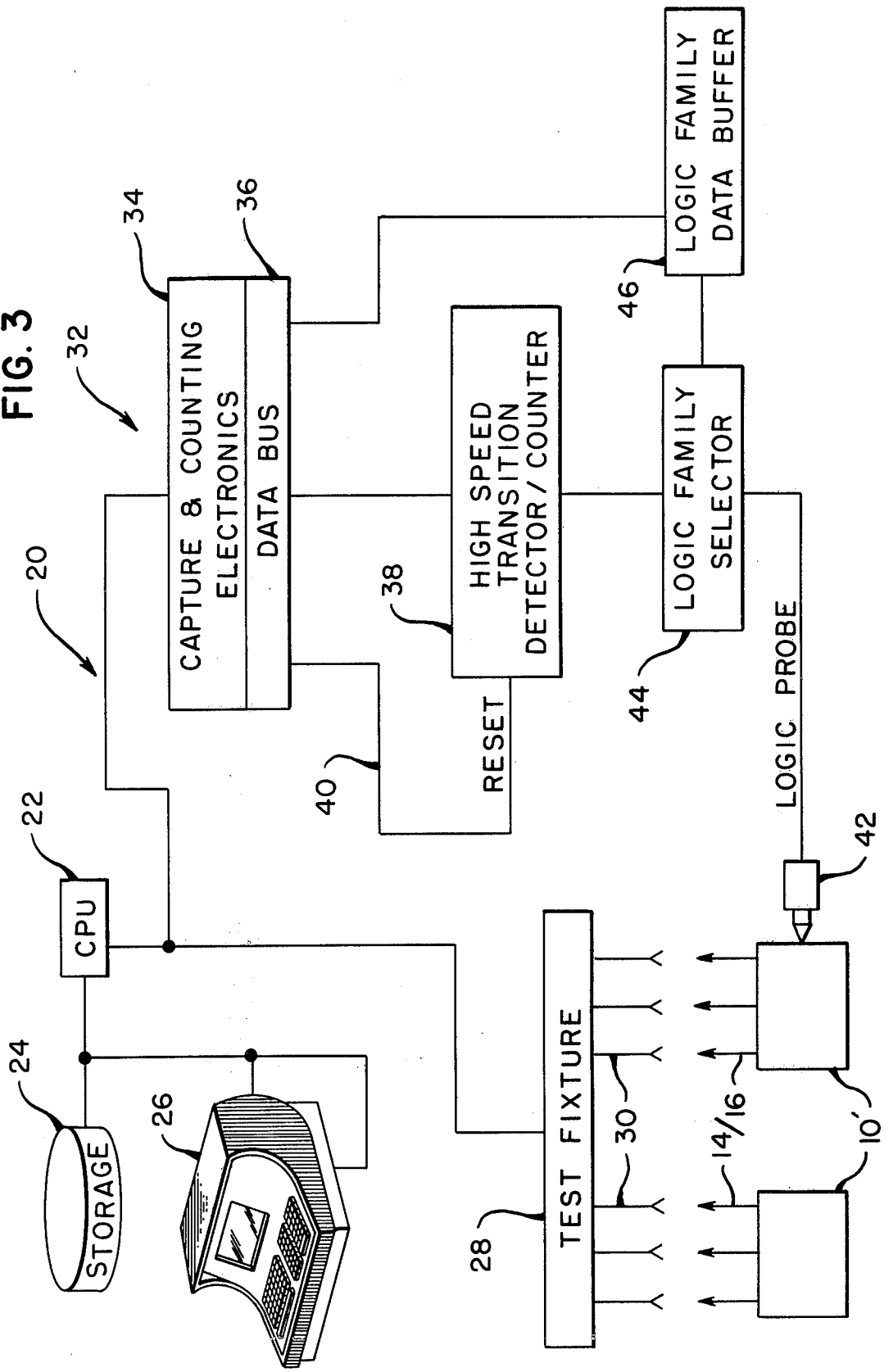

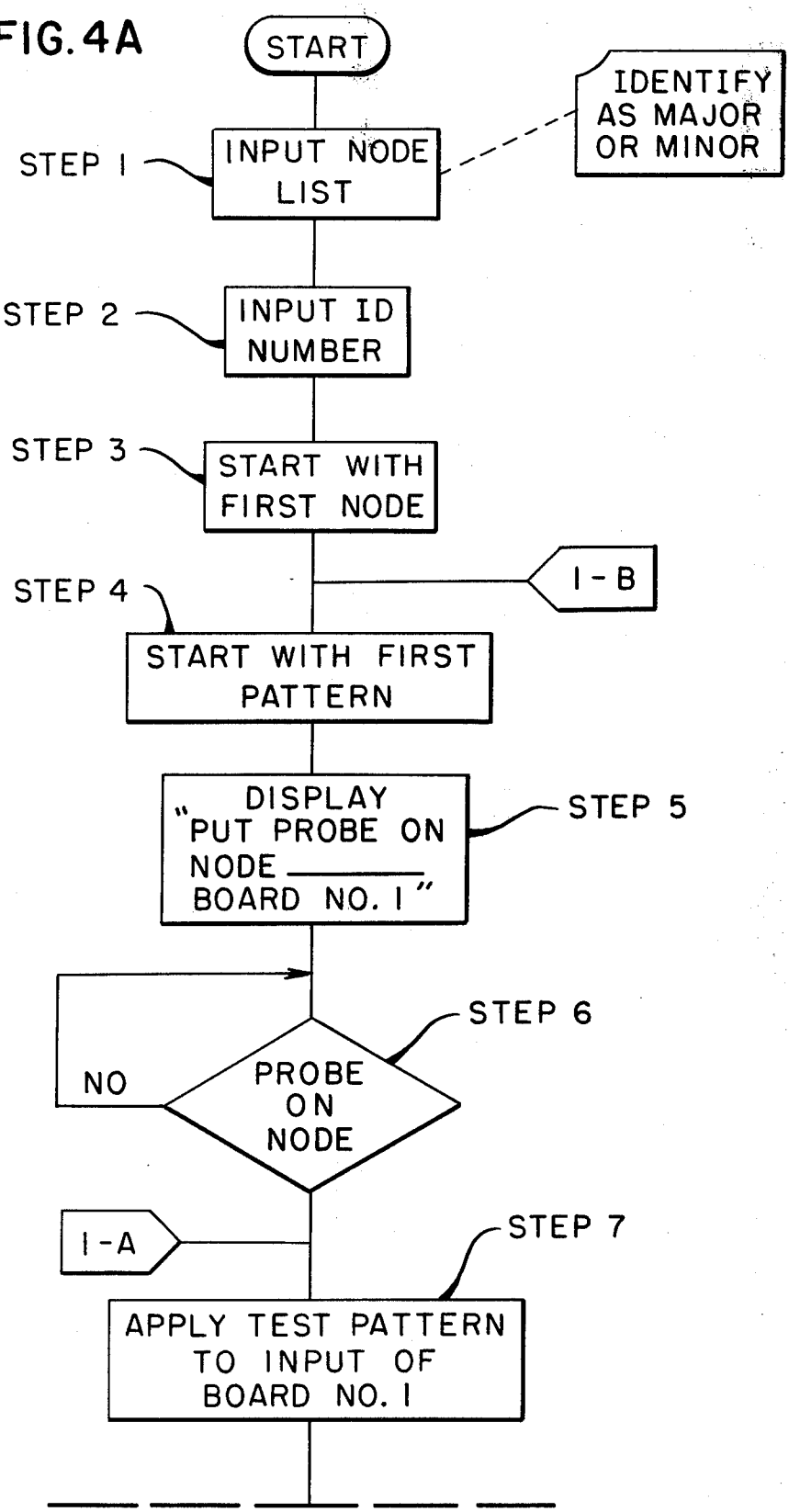

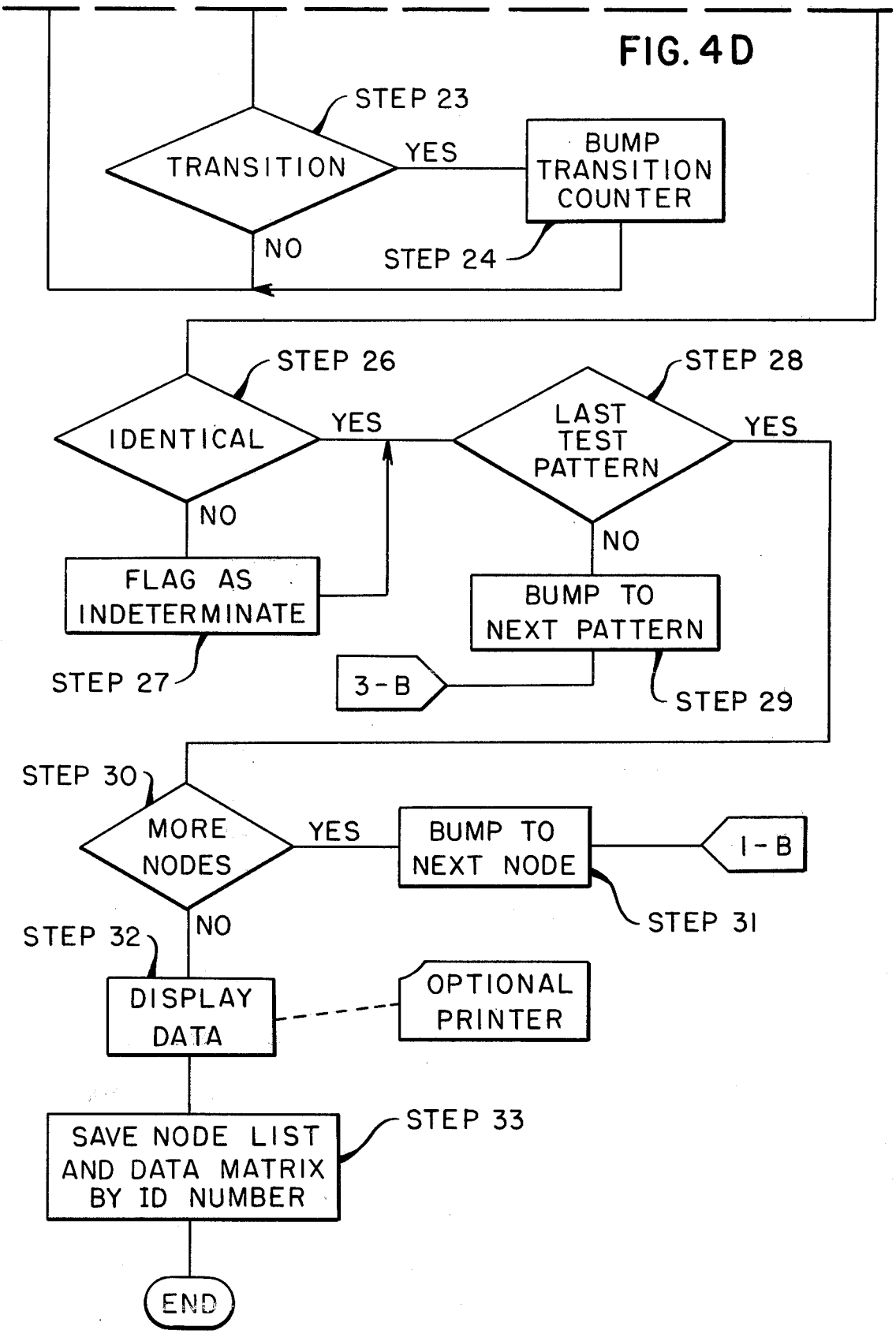

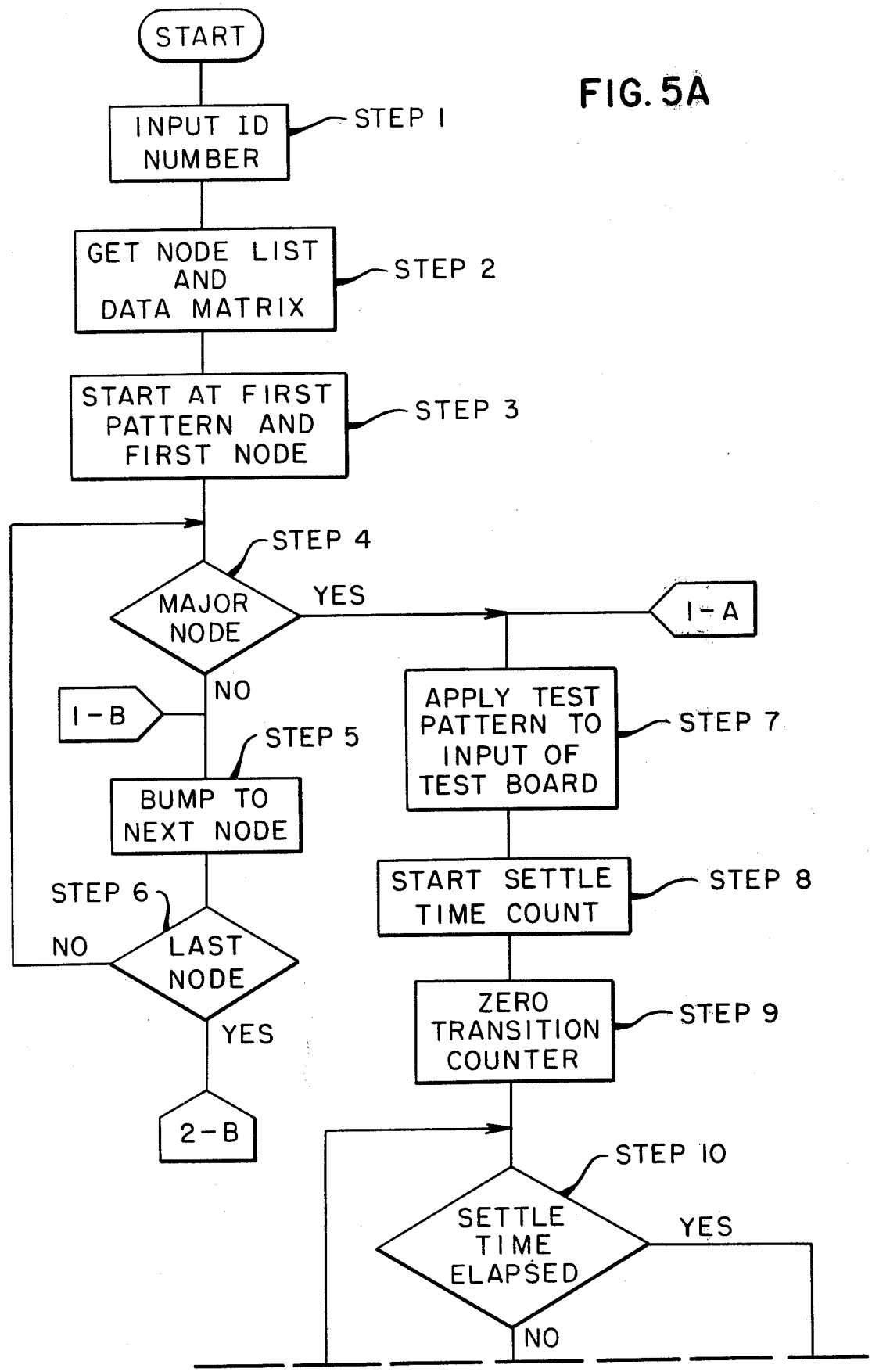

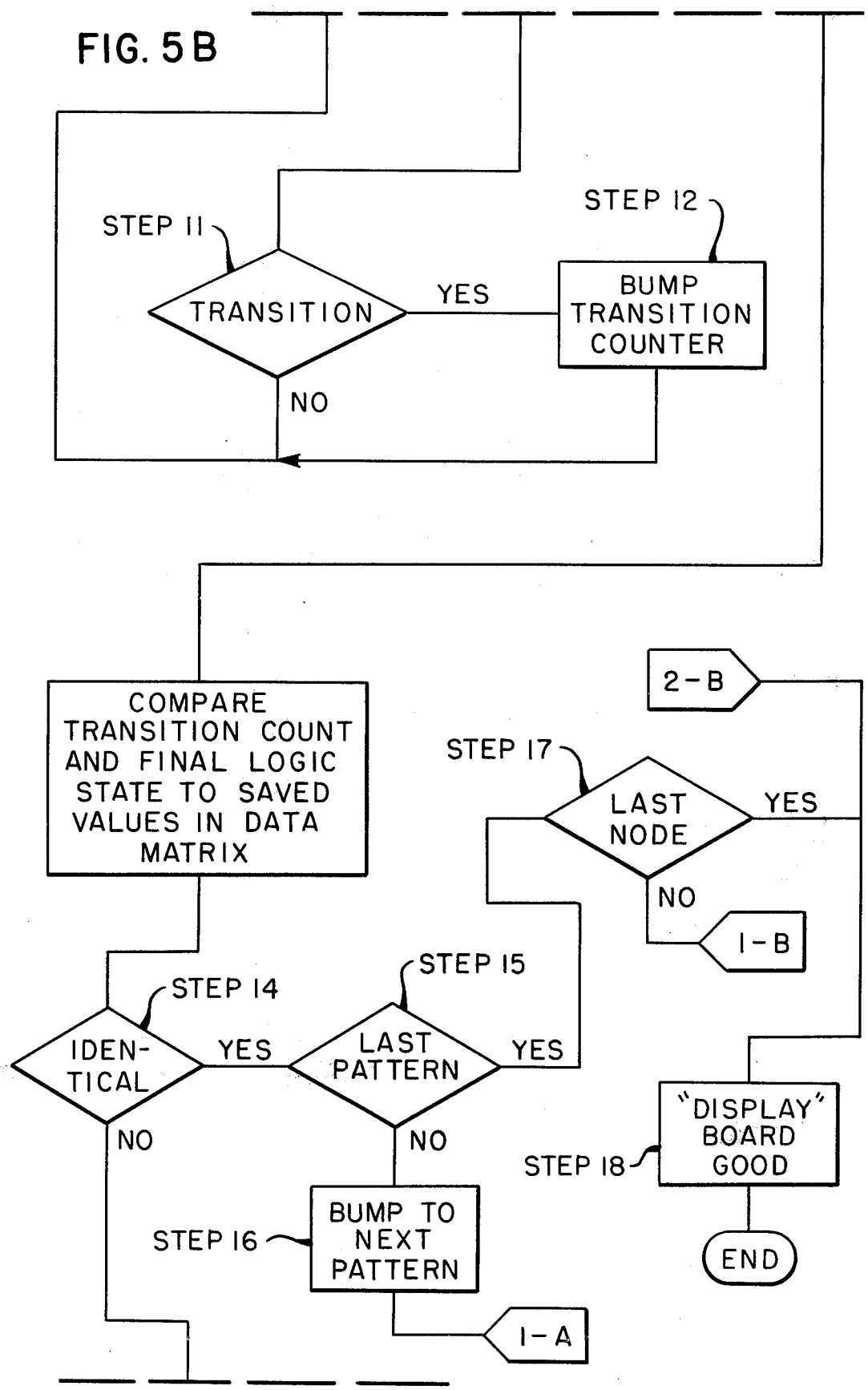

COMPLEX LOGICAL FAULT DETECTION APPARATUS AND METHOD

BACKGROUND OF THE INVENTION

The logic circuits employed within modern computing equipment must be subjected to the epitome of quality assurance techniques. Within computer logic circuitry, failure rates which in other technologies would be considered outstandingly good are considered as catastrophically bad. For example, a logic circuit which drops or picks up a bit in a stream of binary data once every one million bits would be worthless. A single erroneous bit in a data stream can cause an astronomical data error. A single misplaced bit in an instruction can completely change the action taken by the computer in interpreting and executing the instruction so as to cause an irrecoverable error. Accordingly, many manufacturers of logic circuitry have gone to a bootstrap approach wherein known good and constantly monitored logic circuitry is used to check out the new circuitry for malfunctions contained therein.

The malfunctioning of a logic circuit can be very subtle. Such circuitry typically contains numerous flip-flops, gates, and the like interconnected to provide signals between one another and as inputs from and outputs to other logic circuits contained within a major piece of equipment such as a digital computer. Unlike a water valve or an automobile jack which is either working or nonworking, a logic circuit can be working except for one or more unique stimulation patterns. That is, the logic circuit may provide an erroneous output only when stimulated by a first binary input such as 101010 followed by an input of 010101. Any other combination of binary input sequences (of six bits in this case) will cause the logic circuit to behave in a normal manner. Moreover, the aforementioned problem of 101010 followed by 010101 may be an intermittent problem. That is, the malfunction does not occur every time the foregoing sequence is input to the logic circuit. A digital computer thus becomes the only practical device for exercising the logic circuit board inasmuch as the digital computer can be programmed to stimulate the logic circuit with all possible permutations and combinations of input stimulus possible, on a repetitive basis. Moreover, the computer never tires or ceases to diligently watch for malfunctions. Thus, the one in a million malfunction over an extended testing period will be caught.

To accomplish such testing, mechanical fixtures or jigs are provided wherein the printed circuit boards containing the logic circuit can be inserted in a manner substantially identical with their manner of insertion during their intended use. Provision may be made for plugging in one printed circuit board to the fixture or many, depending on the testing installation. A computer is connected to the mechanical fixture so as to be able to output to the board or boards contained therein and to input from the boards. The computer is also connected to typical peripheral devices such as an input-output (I/O) keyboard and display unit as well as magnetic tape, disc, or other mass storage device for the accumulation and storage of data and programs employed in the testing procedure.

Referring briefly to FIG. 1, a simplified drawing of a logic circuit board as tested by the present invention is shown generally as 10. Logic circuit board 10 comprises a printed circuit board 12 having an input contact 14 and an output contact 16 adapted for electrically mating with a contacting receptacle. Between input contact 14 and output contact 16, a logic circuit generally indicated as 18 is disposed comprising a plurality of interconnected logic elements labeled G1 through G11 respectively. Logic elements G1–G11 could be gates, flip-flops, or the like. Throughout the logic circuit 18 there are various "nodes" labeled A through L which are available for testing. It is to be understood that the logic circuit board 10 of FIG. 1 is shown in simplified form only and that the logic circuit boards tested by the present invention typically employ more than a single input and single output contact.

If a stimulating input signal is applied to input contact 14, the signal appearing at node A will appear as an input to both logical elements G1 and G2. As can be seen from FIG. 1, even a basically simple logic circuit has built-in complexities. Thus, the output of element G11 finally appearing at node L and the output contact 16 is a function of the logic states at nodes K and I corresponding to the status of elements G10 and G4 respectively. The state of element G10 is, of course, a function of the states of elements G8 and G9 and the state of element G4 is a function of the state of elements G2 and G3, and so forth. Thus, before the output state of element G11 stabilizes, it may fluctuate or change logic state a number of times as the inputs thereto fluctuate in response to changes in state of the preceding elements G1 through G10 taking place.

Typically, such logic circuitry is tested by applying a sequence of preselected input signals to the input contact 14 at spaced intervals sufficient to allow the last elements connected to the output contact 16 to stabilize. The output signals at the output contact 16 corresponding to the output states of the output element are compared to the known proper signal for response by the logic circuit to the particular stimulating input. This approach is useful under normal circumstances in detecting a complete malfunction within the logic circuitry 18 causing a completely erroneous output at the output contact 16. The proper output signal appearing at the output contact 16 is not a guarantee of proper operation of the logic circuit 18, however. In certain instances, one or more of the elements G1 through G11 comprising logic circuit 18 may be "stuck." Such a condition is referred to in many cases as a "stuck at zero" or "S-A-O" fault.

Input and output data associated with a simulation of a circuit such as that shown in FIG. 1 is shown in FIG. 2—both for a normal or "good" circuit and for a circuit having a S-A-O fault at node "I." Referring first to FIG. 2(a), the input is initially a logical zero (0) which, by the time 11.30, has caused the output to go from some unidentified unitialized state to a logical zero (0). At the time 0.0 (designated as T1) a logical one (1) is applied to the input causing the input to change from the previous 0 logic state to a 1 logic state. By the time 1.50, the input has stabilized as a logical 1, where it remains throughout the balance of the sequence. By contrast, it can be seen that the change of the input from a 0 to a 1 state causes a number of logic changes in the output prior to its final stabilization. At time 4.70, the change labeled C1 begins, which causes the output to change from a logical 0 to a logical 1 by time 6.20. At time 6.40, however, change C2 begins, causing the output to switch logical state back to a logical 0 by time 7.90. At time 11.30, change C3 begins, whereby the output once again goes to a logical 1 state by time 12.80.

Finally, at time 12.90, the output begins its final change (labeled C4) which causes the output to reach its final stabilized logic state of 0 by time 14.40.

By contrast, now referring to FIG. 2(b), if the prior art technique of applying a change in input at time T1, delaying until time T4, and then sensing the output were applied, the proper logical 0 state would be read. As can be seen by comparison of the total output sequence, however, with node I stuck at zero the changes at C1 and C2 never occur. The logical 1 at time 6.20 (labeled T2) never occurs. Thus, even by applying one known prior art technique wherein the status of the output immediately preceding its final stabilization is sampled would not detect the stuck at zero fault of the present example. That is, by sampling at time T3 according to the aforementioned technique one would detect the logical 1 at the output followed by change C4 to the final stabilized output of 0. As can be seen, this would not result in the detection of the stuck at zero fault.

Wherefore, it is the object of the present invention to provide a method and apparatus for testing logic circuits capable of detecting such malfunctions as hereinbefore described both for a complete logic circuit assembly and for subassemblies thereof whereby complex logic faults within logic circuits can be detected and isolated to subcircuits thereof.

SUMMARY

The foregoing objective has been accomplished by the method of the present invention which comprises the steps of determining the final logic state achieved at the output node and the number of transitions in logic state of the output node before attaining the final logic state of a known good identical logic circuit in response to a preselected input to the input node; determining the final logic state achieved at the output node and the number of transitions in logic state of the output node before attaining the final logic state of the logic circuit to be tested in response to the same preselected input used with the known good identical logic circuit; and, indicating an error condition if either the final logic states or number of transitions determined are not identical. In the preferred embodiment, the foregoing procedure is repeated with a plurality of different test patterns. Additionally, two known good circuits are first compared for a plurality of test patterns and those test patterns causing different outputs are labeled as indeterminant. In the subsequent testing of the logic circuit to be tested against the previously stored data from the known good logic circuits, error conditions occurring from indeterminant input test patterns are so labeled whereby the operator is put on notice of a possible error condition but not falsely led to conclude that an error condition exists where one, perhaps, does not exist. To accomplish the foregoing, apparatus is disclosed comprising means for applying a binary signal to the input; means for sensing the binary output; means connected to the sensing means for sensing the logic state of the output; means connected to the logic state sensing means for counting transitions in the logic state of the output; control means connected to the signal applying means, the output logic state sensing means and the counting means for applying a preselected binary test pattern to the input of a logic circuit, counting the number of transitions in logic state of the output of the logic circuit from the application of the test pattern until a stabilized output state is reached, saving the number of transitions counted and the logic state of the stabilized output for each test pattern, and comparing the transitions counted and final logic state as stored to the transitions counted and final logic state of a logic circuit being tested.

DESCRIPTION OF THE DRAWINGS

FIG. 2 is a tabular representation of the inputs and outputs by time sequence of the circuit of FIG. 1 as simulated under normal operating conditions and as simulated with a stuck at zero fault at one node therein.

FIG. 3 is a simplified drawing of test apparatus used to employ the method of the present invention.

FIG. 4 comprising FIGS. 4A-4D is a logic flowchart of logic which can be employed to develop the data associated with a known good logic circuit to be used as the test comparison data set when practicing the method of the present invention.

FIG. 5 comprising FIGS. 5A-5E is a logic flowchart of logic which can be employed to practice the testing sequence of the method of the present invention wherein a logic circuit board is tested against previously gathered data associated with a known good identical logic circuit to establish both the overall operability of the logic circuit being tested as well as isolating the area of malfunction on logic circuits proving to have a defect therein.

DESCRIPTION OF THE PREFERRED EMBODIMENT

Figure 1:
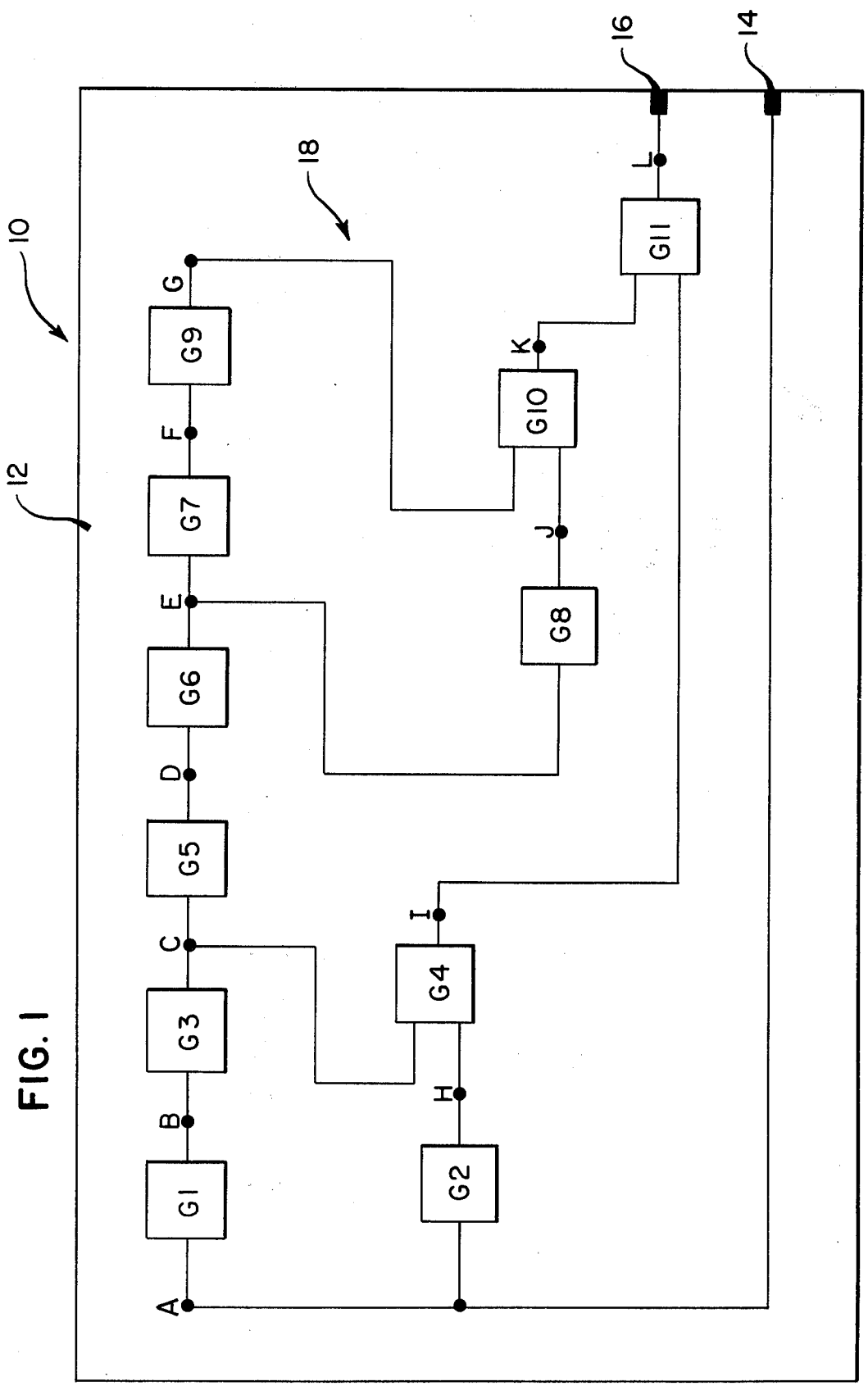
FIG. 1 is a simplified drawing of a logic circuit board as would be tested by the present invention.

Referring first to FIG. 3, a block diagram of apparatus for practicing the specific method of the present invention is disclosed in simplified form. The specifics of each test installation will, of course, depend upon the type of logic circuit to be tested and the computing and test equipment available. Techniques for adapting or constructing apparatus to perform the functions to be hereinafter described are well within the capabilities of those skilled in the art without undue experimentation and, the specific construction of such apparatus, forms no part of the present invention.

The test apparatus shown generally as 20 comprises a computing central processing unit (CPU) 22 to which is attached a storage device 24 and an operator's I/O console 26. It is preferred that storage device 24 be a device such as a magnetic tape unit or disc drive wherein the storage element (i.e. magnetic tape or disc pack) is removable whereby prestored data and the programming associated therewith for accomplishing the testing of a particular logic circuit can be removed and placed in safe storage during periods of non-use. A test fixture 28 is connected to the CPU 22 having connectors 30 for releasable connection to the input contacts 14 and output contacts 16 of one or more logic circuit boards 10'. Data capture apparatus generally indicated as 32 is connected to both test fixture 28 and CPU 22. The data capture apparatus 32 comprises capture and counting electronics 34 having a data bus 36 therein. Additionally, high speed transition detection and counter apparatus 38 is connected as an input to data bus 36, being reset by reset line 40 from data bus 36. A logic probe 42 for attachment by an operator to specific nodes within the logic circuit boards 10' in a manner to be described hereinafter is connected through a logic family selector 44 to high speed transition detection and counting apparatus 38. Logic family selector 44 is controlled by logic family data buffer 46 which in turn is connected to data bus 36. The propagation of logic signals within computer logic circuitry is usually taking place at a rate faster than the computer employed in the test apparatus can compute. That is, there is no way that the CPU 22 can, itself, sense the status of the outputs of the logic circuit boards 10' and compute decisions as to their transitions. As with many applications within computer technology wherein time mismatched elements must work together, the data must be buffered and gathered in an asynchronous manner by auxiliary equipment. This is the function of test fixture 28 in conjunction with data capture apparatus 32. Thus, a generalized command is issued by CPU 22 and the accomplishment thereof is made by test fixture 28 and data capture apparatus 32. The various elements of FIG. 3 will be referred to and functionally described hereinafter as they apply to the specific steps in accomplishing the method of the present invention.

The preferred logic sequence to be employed in the apparatus of FIG. 3 to gather the test data on a known good logic circuit to be employed in the testing of a logic circuit of unknown condition is shown in FIGS. 4(A) through 4(D). Thus, the CPU 22, test fixture 28, and data capture apparatus 32 of FIG. 3 must singly or in combination contain logic to accomplish the logic sequence set forth in FIGS. 4(A) through 4(D). As previously stated, the precise method of accomplishing the logic of FIGS. 4(A) through 4(D) (as well as the logic of FIGS. 5(A) through 5(E) to be described hereinafter) will depend upon the equipment comprising CPU 22, test fixture 28, and data capture apparatus 32. As used herein, the term "known good logic circuit" can mean either an actual logic circuit previously tested and known to properly perform its logic functions or a simulation of the logic circuit to be tested accomplished by any one of the methods well-known to those in the simulation art. It is a basic technique of the preferred embodiment of the present invention that the data used for comparison be generated by comparing two known good logic circuits together. Since the intent of such comparison is to precipitate the identification of indeterminant patterns (i.e. those cases wherein the logic behaves in a different intermediate manner even in known good logic circuits because of slight dissimilarities such as in component tolerance) both known good logic circuits compared should not be simulations thereof inasmuch as the simulations will behave in a predictable manner and not, therefore, precipitate the indeterminant states.

Beginning at START in FIG. 4(A), the logic first inputs a node list (step 1). The nodes can be identified in any convenient manner such that the operator and logic can communicate at a later time so that the logic can request the operator to place the logic probe 42 at a particular node as necessary in the logic sequence. An input identification number is then input to be associated with the data being gathered so that when testing a similar logic circuit board at a later date the previously stored data can be recalled by its proper identification number and distinguished from other data contained within storage device 24 (step 2). The logic next starts with the first node and the first test pattern (step 3 and step 4). This can be accomplished by any number of well-known techniques such as setting a pointer to the beginning of a threaded list, or resetting an index to the starting position. Note that in the preferred embodiment the nodes are identified as "major" or "minor" nodes. Typically, the main output from the logic circuit (such as that labeled L in FIG. 1) would be the single major node and the remaining nodes B through K would be designated as minor nodes. In this manner, the testing logic can first check the major nodes to see if the logic circuit is operating as a whole in the proper manner. If it is, no further testing needs to be accomplished. In the event that there is a malfunction somewhere, a sequential testing of the minor nodes can be used to isolate the fault within a specific area of the logic circuit.

The logic next displays to the operator a message indicating that he should put the probe 42 on the node presently being investigated (step 5). On the first pass through as presently being described, this would be the first node on the node list which, using FIG. 1 as an example would most likely be minor node B. If the test fixture 28 has more than one position for the connection of logic circuit boards 10' thereto, the message should indicate as well that it is the first known good board being used and connect its inputs accordingly. Note that if the "known good logic circuit" is a simulation, the display and movement of the probe 42 can be eliminated. The logic next must wait (step 6) until the probe is connected to the node (since the logic can move much faster than the operator can react in real-time to attach the probe 42 to the proper node). When the probe has been properly placed, the test pattern is applied (step 7) to the input of the first board 10' (or simulation). Moving now to FIG. 4(B), a "settle time" counter is next started (step 8). Counting elapsed time sufficient for the circuit to settle to its final logic output state provides a convenient method in such testing apparatus wherein time is not at a premium. Other methods, of course, could be employed if desired. The transition counter is also zeroed at this time (step 9). In the apparatus of FIG. 3, this would correspond to causing a reset signal to be sent on reset line 40 to the high speed transition detection and counter apparatus 38. The logic next checks to see if the settle time has elasped (step 10). If not, the logic checks to see if a transition in logic state has occurred (step 11). In the apparatus of FIG. 3, this test would be conducted by the hardware logic of high speed transition detector 38. If a transition in logic state has occurred, the transition counter is bumped to reflect such transition occurrence (step 12). In either event, the logic returns to step 10 to check for the elapsing of the settle time. When the settle time has elapsed (i.e. the logic state of the output has reached its final state) the logic saves the transition count and the final logic state (step 13). This is conveniently done by employing a data matrix identified and indexed by identification number, node, and test pattern. The logic next checks to see if the last test pattern has been applied to the input (step 14). If not, the logic bumps to the next test pattern (step 15) and returns to off-page connector 1-A in FIG. 4(A) between steps 6 and 7.

Figure 4B:
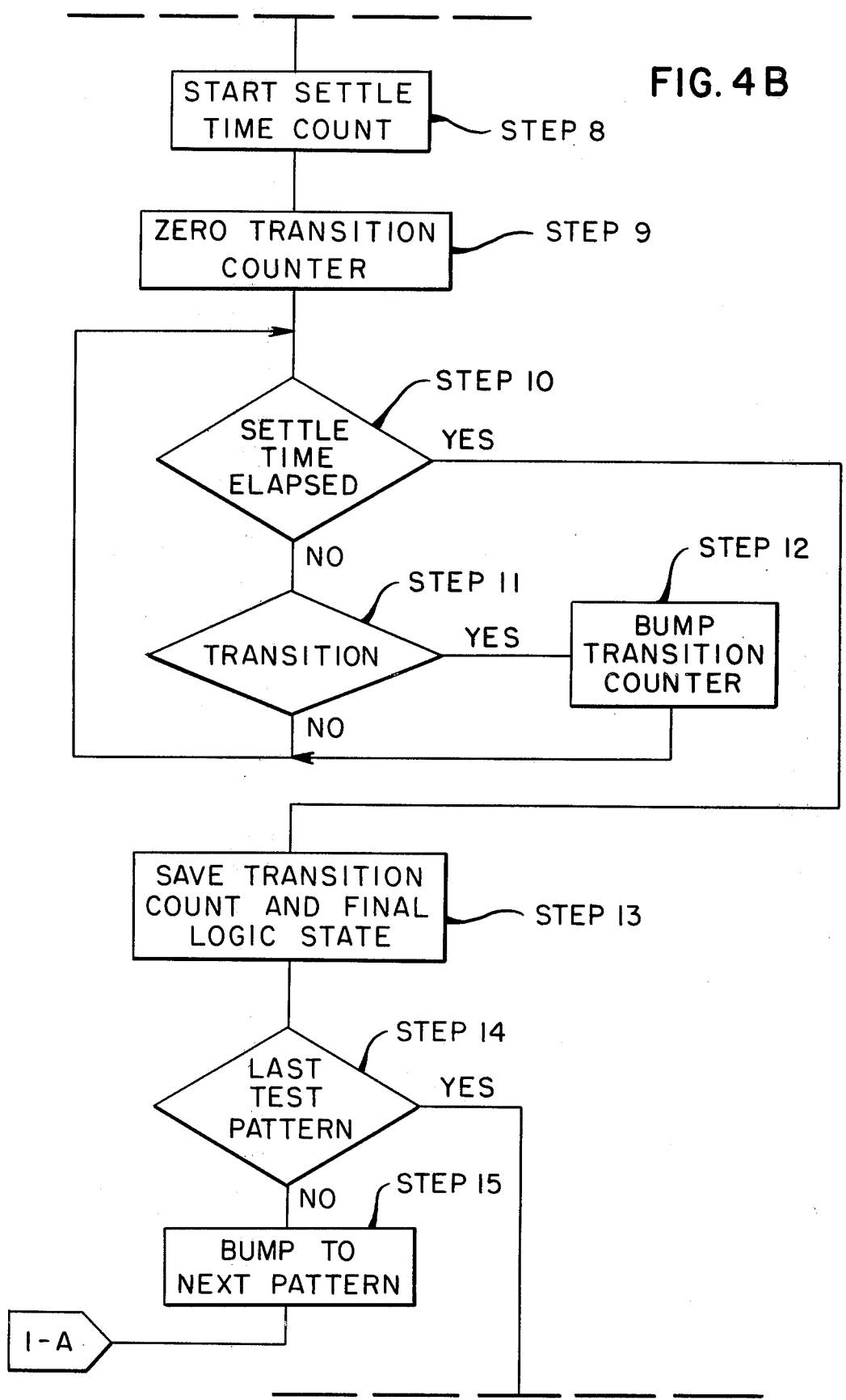
Figure 4C:
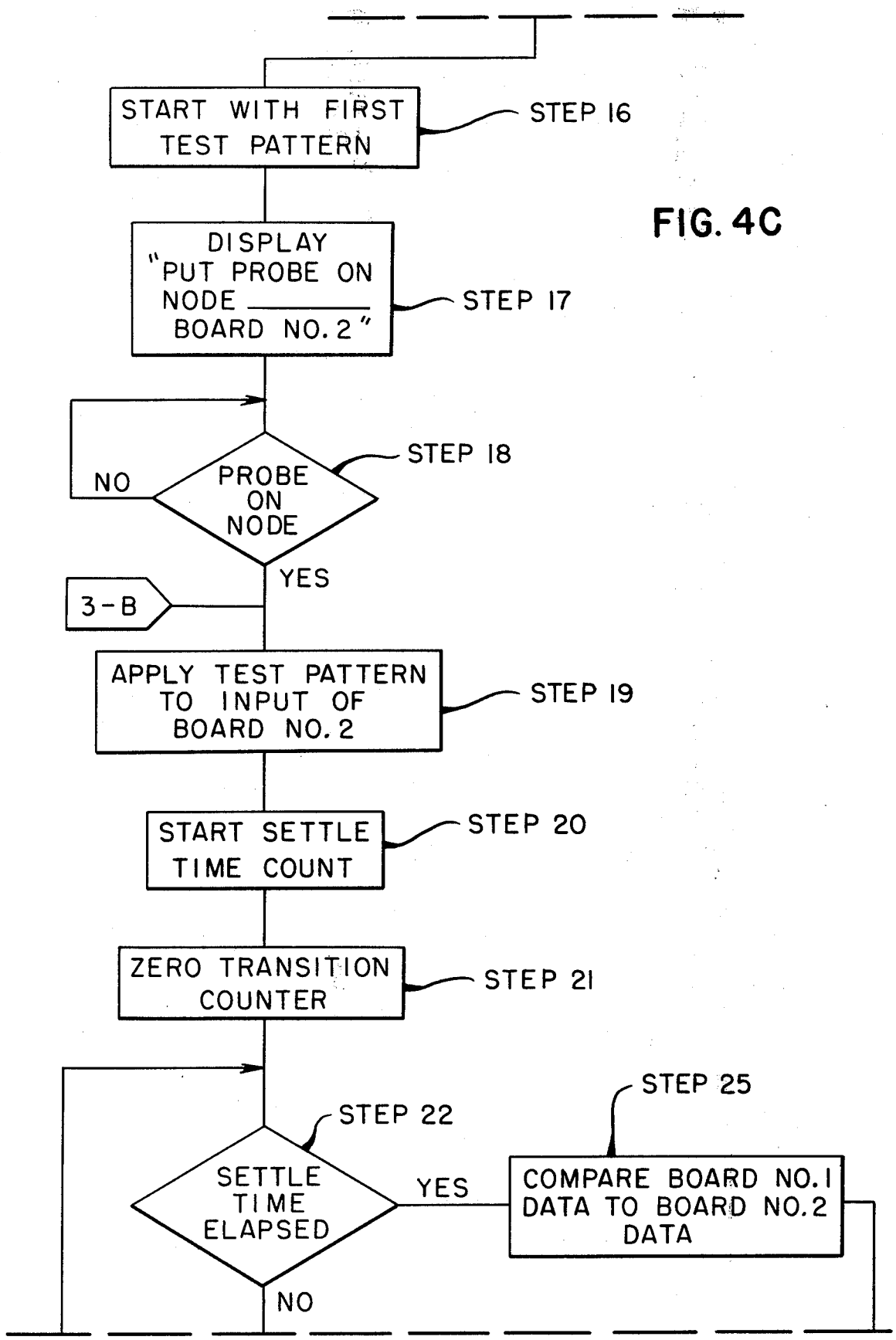

When the last test pattern has been applied, all the data for the first node of the first known good logic circuit (or simulation thereof) has been gathered. This is preferably now stored within the data matrix located on storage device 24. The logic now is ready to continue to gather corresponding data for the second board (or simulation thereof) by continuing on to FIG. 4(C). In FIG. 4(C), the logic first starts by resetting the test pattern to the first test pattern employed in stimulating the first node of the first board (step 16). The operator is once again requested to connect the probe 42 to the corresponding node on the second known good board (step 17). When the logic determines that the probe has been placed on the node (step 18) (as by an input by the operator through the keyboard one the I/O console 26) the logic applies the test pattern to the input of the second board (step 19), starts the settle time count (step 20) and zeroes the transition counter (step 21) in the same manner as previously discussed. In like manner, transitions are again counted by the logic until such time as the settle time has elapsed (steps 22, 23, and 24).

When the settle time has elapsed, the data gathered with respect to board number one is compared to the data gathered with respect to board number two (step 25) and transfer is made to step 26 in FIG. 4(D). If the data is not identical (step 26), the entry within the data matrix is flagged as being "indeterminant" (step 27). Again, the "indeterminant" state is when different results are obtained from two known good boards. The logic next checks to see if the last test pattern has been applied (step 28). If not, the logic bumps to the next test pattern (step 29) and returns to off-page connector 3-B in FIG. 4(C) between steps 18 and 19. If the last test pattern has been completed, as with board number one, this signfies that the first node has been completely tested.

The logic next checks to see if there are more nodes on the list of nodes to be checked (step 30). While not preferred, the "node list" could be eliminated and at this point the operator could be requested to identify the next node, if any, through the I/O console. If there are more nodes, the logic bumps to the next node (step 31) and returns to off-page connector 1-B in FIG. 4(A) between steps 3 and 4. It will be noted that, once again, a matter of choice has been employed within the preferred embodiment of the present invention. That is, the first node is tested for the first board and then the first node is tested for the second board followed by the testing of the second node of the first board and the testing of the second node of the second board et sequence. This is a matter of choice in particular test apparatus employed by the assignee of the present invention only. It should be apparent that by appropriate and obvious modification of the logic hereinbefore described, all the nodes of the first board could be checked and the data therefrom stored within the data matrix and then the second board could be tested node by node in sequence and compared to the previously stored data from the first board. Since no actual operator interaction is required in the method of the present invention (through the placement of the logic probe 42), it has been found by applicant that there is less likelihood of miscomparison of data if the boards are alternated so as to result in comparison alternately of the same nodes in sequence. In any regard, following the completion of the gathering and comparison of data for both known good circuits (or one circuit and one simulation) the data gathered and maintained within the data matrix can optionally be displayed to the operator for his review thereof (step 32). This can also conveniently be accomplished by connecting a printing device (not shown) to the CPU 22 whereby the data contained within the data matrix on storage unit 24 can be printed by CPU 22 on the printer for a hard copy listing often found to be quite useful. The node list and data matrix are finally saved by the ID number from step 2 (step 33) and the logic terminates at END.

Referring now to FIGS. 5(A) through 5(E), a logic sequence for accomplishing the testing of a circuit board against the previously stored "good board" data obtained from the logic of FIGS. 4(A) through 4(D) is shown. Upon starting at START in FIG. 5(A), the logic first must get an identification (ID) number associated with the logic circuit to be tested for correlation with the data (step 1). This is most conveniently done by the operator using the I/O console 26. Using the identification number, the associated node list and data matrix can be located on the storage medium 24 and retrieved for use by the logic (step 2). It will be apparent to those skilled in the art that the identification number can be eliminated by dedicating a unit of input medium such as a magnetic tape to the storage of the data. Even in such case, however, it is good practice to employ an identification number stored with the data and entered at the time of the test either automatically or by the operator through the I/O console 26 so as to verify that the data being used for the specific test is that associated with the logic circuit being tested.

Using the stored data thus retrieved, the logic starts with the first test pattern and the first node on the list (step 3). The logic, according to the preferred embodiment, first checks to see if the node is a major node (step 4). This technique allows the board to be checked in its entirety (by assigning only one major node as the output of the logic circuit) or in major segments as hereinbefore described. If it is desired to check all the nodes in sequence every time, the logic associated with major and minor nodes hereinafter described can be eliminated to, thereby, cause all the nodes to be tested. If the first node on the list is not designated as a major node, the logic bumps to the next node (step 5) and, if not the last node (step 6), returns to the major node test at step 4. In the preferred embodiment of the present invention and the logic of FIGS. 4(A) through 4(D) and 5(A) through 5(E), it is also assumed that the major nodes are connected to output contacts 16 on the printed circuit board 10' whereby the signals thereon can be read through connectors 30 on test fixture 28 of FIG. 3 as opposed to needing the logic probe 42. Such an assumption and the actual application thereof speeds up the testing of logic circuits boards by requiring operator intervention only for the changing of boards, unless a malfunction is found at a major node.

When a major node has been found in step 4, the logic applies the test pattern to the input of the test board (step 7), starts the settle time counter (step 8), zeroes the transition counter (step 9), and counts transitions (steps 10, 11 and 12) until the settle time has elapsed in a substantially identical manner to logic previously discussed in conjunction with FIGS. 4(A) through 4(D). When the settle time has elapsed the logic continues at step 13 in FIG. 5(B) where it compares the transition count and final logic state obtained for the test board to those values saved in the data matrix corresponding to the node and test pattern employed. If there is identity between the tested values and the saved values (step 14), the logic checks to see if the last test pattern has been applied (step 15). If not, the logic bumps to the next test pattern (step 16) and branches to connector 1-A in FIG. 5(A) between steps 4 and 7. If the last pattern has been tested, the logic checks for the last node having been checked (step 17). If the last node has not been checked, the logic branches to connector 1-B in FIG. 5(A) between steps 4 and 5. Continuing on the same logic path at step 17, if the last node has been reached with identity of test values and saved values having been obtained for all test patterns, the logic displays an output such as "board good" to the operator (step 18) and ends the test sequence at END. Any time the logic finds that there is non-identity between the tested values and the saved values at step 14, the identifying number associated with the major node is saved for later display in conjunction with an error message (step 19) in FIG. 5(C).

After saving the major node identifier at step 19, the logic next begins the aforementioned procedure of isolating the cause of the error at the major node. To this end, it must now test the responses at the minor nodes between the major node in error and the next preceding major node. The logic begins this task by decrementing to the next preceding node (step 20). This node is checked to see if it is a major node or an input node (step 21). The logic continues to decrement back through the node list (steps 20 and 21) until the next major node (or the input node) is found. When it is found, the logic bumps forward to the next subsequent node (step 22). The logic next checks to see if this node is a major node (step 23). On the first time through this logic path, a "yes" answer indicates that there were no minor nodes between the major node which failed and the next preceding major node which did not fail (or the input node).

Figure 5C:
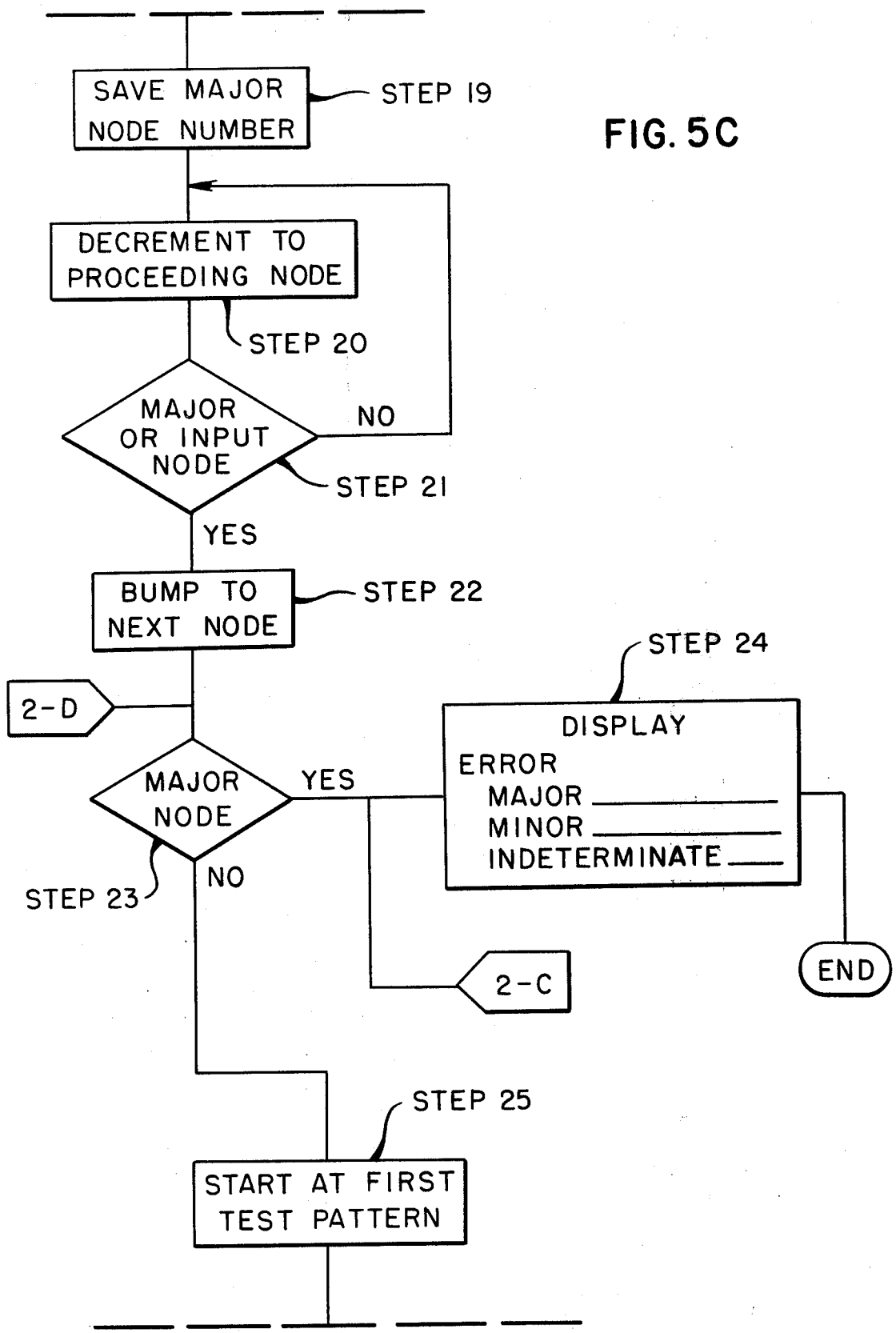
Figure 5D:
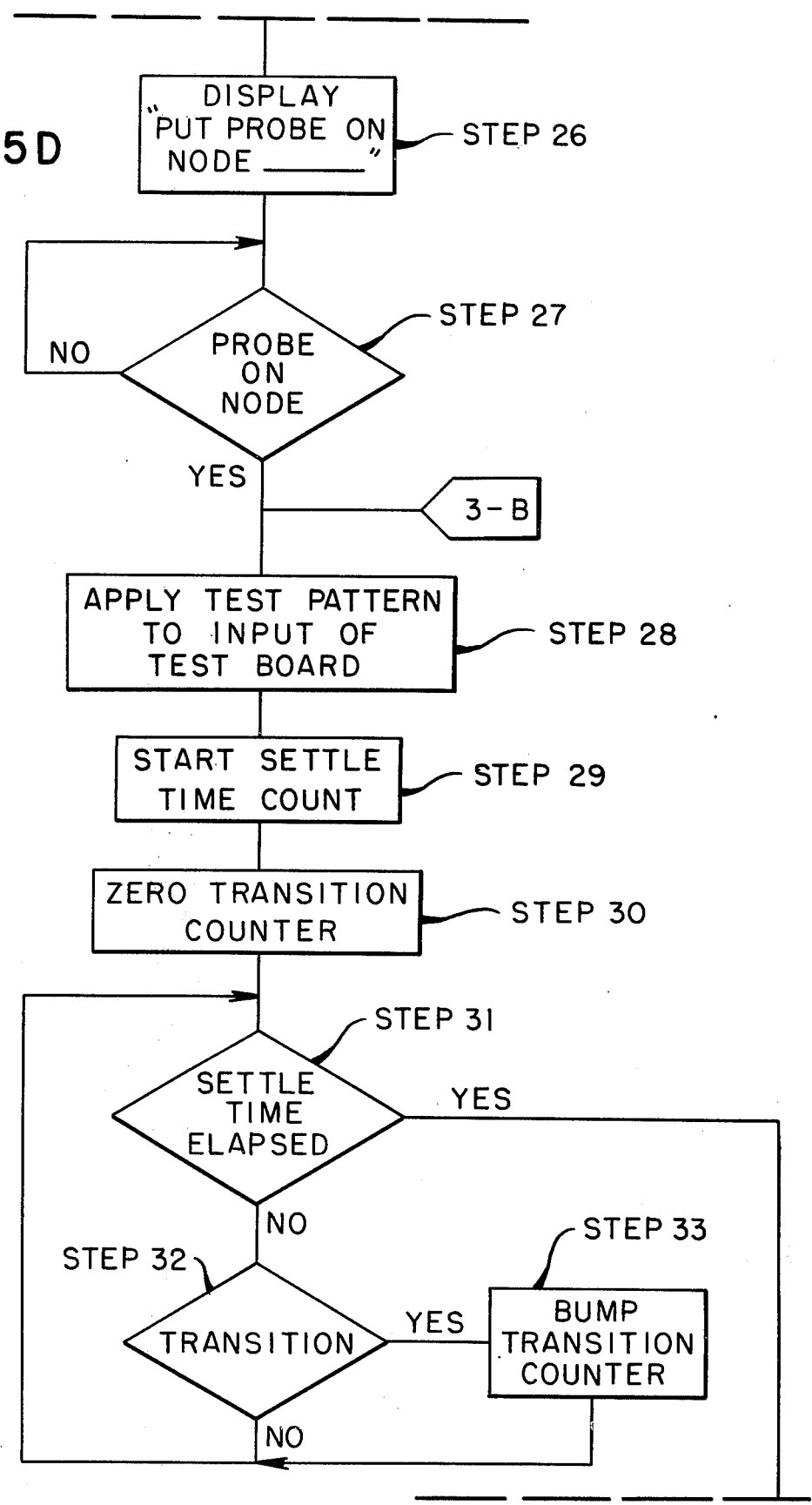
Figure 5E:
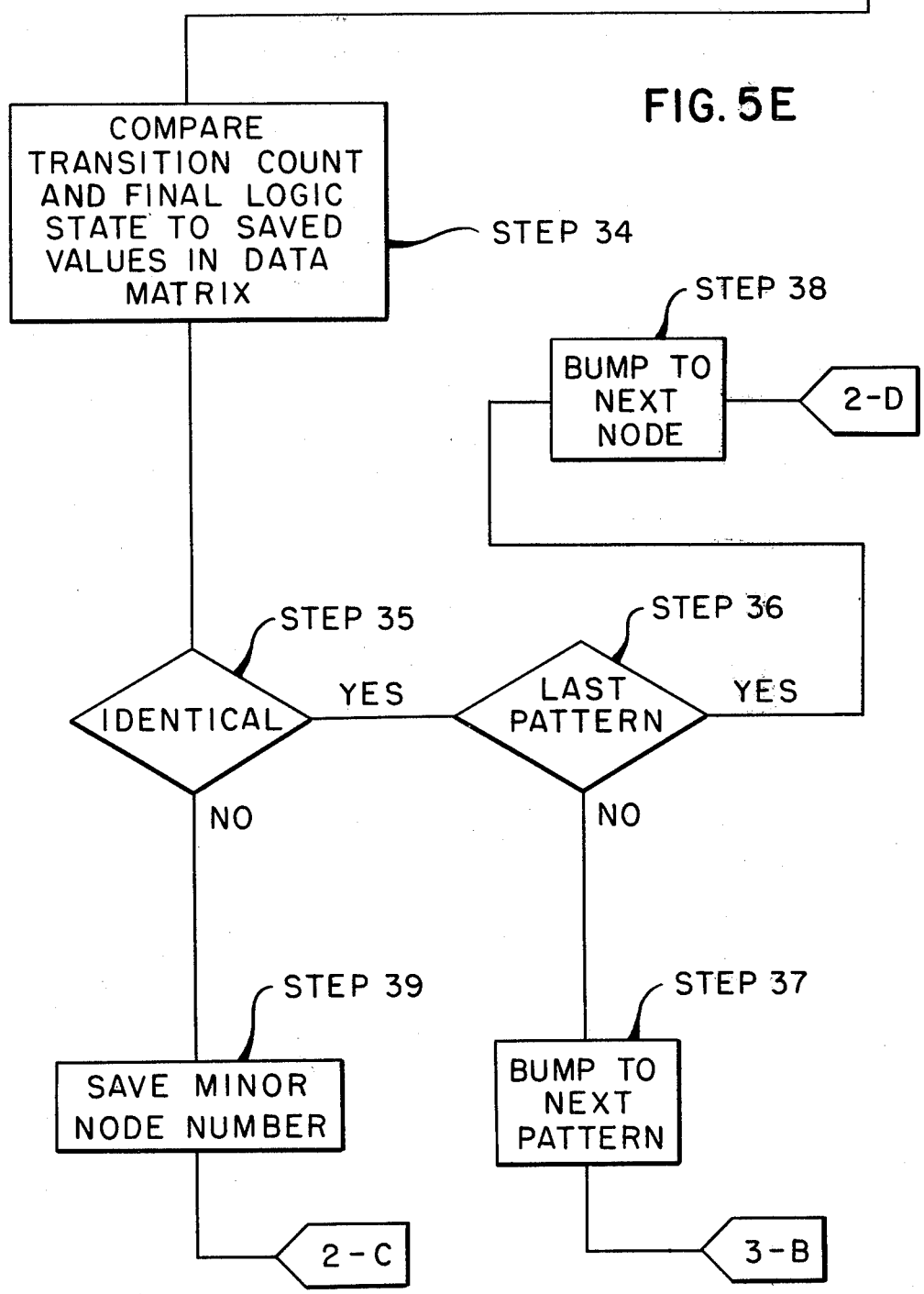

Assuming momentarily that a minor (or intermediate) node does exist in the logic circuit being tested, the logic restarts the test pattern sequence at the first test input pattern (step 25) and continues on to FIG. 5(D). The logic next displays a message to the operator requesting that the probe 42 be placed on the first minor node (step 26). When the logic determines that the probe has been placed at the desired node (step 27), it accomplishes a logic sequence as previously discussed wherein the test pattern is applied (step 28), the settle time counter is started (step 29), the transition counter is zeroed (step 30), and transitions are counted until the settle time has elapsed (steps 31, 32 and 33). When the settle time associated with the minor node being tested has elapsed, transfer is made to step 34 in FIG. 5(E) where the logic compares the transition count and final logic state attained to the saved values from the data matrix for the minor node under test. If they are identical (step 35), the logic next determines if the last test pattern has been applied (step 36). If the last test pattern has not been applied, the logic bumps to the next pattern (step 37) and transfers to connector 3-B in FIG. 5(D) between steps 27 and 28. If the last pattern has been applied, the logic bumps to the next node (step 38) and branches to connector 2-D in FIG. 5(C) between steps 22 and 23.

When a non-identity is found at step 35 between the saved and tested data for a minor node, the minor node number is saved (step 39) and transfer is made to connector 2-C in FIG. 5(C) between steps 23 and 24. Upon such transfer or upon arriving at the next major node in step 23, the logic uses the saved major node number and saved minor node number (if any) in conjunction with the indeterminant tags associated therewith from the data matrix to display to the operator the fact that an error condition has been found in conjunction with the board being tested along with the identifiers of the major and minor nodes affected, as well as any indeterminant status previously found in conjunction therewith (step 24) and terminates at END.

Thus, it can be seen that by incorporating logic such as set forth and described in conjunction with FIGS. 4(A) through 4(D) and 5(A) through 5(E) within test apparatus such as that shown in FIG. 3, a logic circuit test facility can be constructed and operated which will test and isolate complex logic faults within logic circuitry not heretofore possible with the testing apparatus and techniques of the prior art.

Wherefore, having thus described our invention, we claim:

1. The method of testing a logic circuit having a binary input thereto and a binary output therefrom for error producing malfunctions comprising the steps of:
    (a) applying a plurality of preselected binary test patterns to the input of a first known good identical logic circuit according to a preselected sequence;
    (b) counting the number of transitions in logic state of the output of the first known good identical logic circuit from the application of each binary test pattern until a stabilized output state is reached;
    (c) saving the number of transitions counted and the logic state of the stabilized output for each binary test pattern of the first known good identical logic circuit;
    (d) applying the plurality of preselected binary test patterns of step (a) to the input of a second known good identical logic circuit according to the sequence of step (a);
    (e) counting the number of transitions in logic state of the output of the second known good identical logic circuit from the application of each binary test pattern until a stabilized output state is reached;
    (f) comparing the transitions counted and final logic state of the first known good identical logic circuit to those of the second known good identical logic circuit for each test pattern;
    (g) tagging as an indeterminate value each transition count and logic state saved in step (c) which does not compare identically with the respective transition count and logic state determined for the second known good identical logic circuit;
    (h) applying the plurality of preselected binary test patterns used in step (a) to the input of the logic circuit to be tested according to the sequence of step (a);
    (i) counting the number of transitions in logic state of the output of the logic circuit being tested from the application of each binary test pattern until a stabilized output state is reached;
    (j) comparing the transitions counted and final logic states as saved in step (c) and tagged in step (g) to those of the logic circuit being tested for each test pattern; and,
    (k) indicating an error condition if either the compared transitions count or final logic state associated with a test pattern is not identical.

2. The method of testing a logic circuit as claimed in claim 1 wherein:
    an error condition is indicated in step (k) only when additionally the non-identical compared transition count or final logic state is not tagged indeterminate.

3. The method of testing a logic circuit as claimed in claim 1 and additionally comprising the step of:
    indicating an error condition with an indeterminate state if either the compared transition count or final logic state associated with a particular binary test pattern is not identical and is tagged as indeterminate.

4. Apparatus for testing a logic circuit having a binary input thereto and a binary output therefrom for error producing malfunctions comprising:
    (a) means for applying a binary signal to the input;

(b) means for sensing the binary output;
(c) means connected to said sensing means for sensing the logic state of the output;
(d) means connected to said logic state sensing means for counting transitions in the logic state of the output;
(e) control means connected to said signal applying means, said output logic state sensing means and said counting means, said control means including logic for accomplishing the steps of:
(1) applying a plurality of preselected binary test patterns to the input of a first known good identical logic circuit according to a preselected sequence;
(2) counting the number of transitions in logic state of the output of the first known good identical logic circuit from the application of each binary test pattern until a stabilized output state is reached;
(3) saving the number of transitions counted and the logic state of the stabilized output for each binary test pattern of the first known good identical logic circuit;
(4) applying the plurality of preselected binary test patterns used in step (1) to the input of a second known good identical logic circuit according to the sequence used in step (1);
(5) counting the number of transitions in logic state of the output of the second known good identical logic circuit from the application of each binary test pattern until a stabilized output state is reached;
(6) comparing the transitions counted and final logic state of the first known good identical logic circuit to those of the second known good identical logic circuit for each test pattern;
(7) tagging as an indeterminate value each transition count and logic state saved in step (3) which does not compare identically with the respective transition count and logic state determined for the second known good identical logic circuit;
(8) applying the plurality of preselected binary test patterns used in step (1) to the input of the logic circuit to be tested according to the sequence used in step (1);
(9) counting the number of transitions in logic state of the output of the logic circuit being tested from the application of each binary test pattern until a stabilized output state is reached;
(10) comparing the transitions counted and final logic states as saved in step (3) and tagged in step (7) to those of the logic circuit being tested for each test pattern; and,
(11) indicating an error condition if either the compared transition count or final logic state associated with a test pattern is not identical.

5. The apparatus claimed in claim 4 wherein:
said logic is adapted to indicate an error condition in step (k) only when additionally the non-identical compared transition count or final logic state is not tagged indeterminate.

6. The apparatus claimed in claim 4 wherein:
said logic is additionally adapted to indicate an error condition with an indeterminate state if either the compared transition count or final logic state associated with a particular binary test pattern is not identical and is tagged as indeterminate.

7. The apparatus claimed in claim 4 and additionally comprising:
(a) display means for displaying locations on a logic circuit where a sensing probe is to be placed; and,
(b) a sensing probe connected to said logic state sensing means and adapted to be connected to points in a logic circuit being tested between the input and output thereof.

8. The apparatus claimed in claim 7 wherein said control means includes logic for accomplishing the steps of:
(a) displaying a request that an operator connect said probe to a point intermediate the input and output of a first known good identical logic circuit prior to the execution of step (1) of claim 4;
(b) displaying a request that an operator connect said probe to the intermediate point used in step (a) of a second known good identical logic circuit, prior to execution, of step (4) of claim 4; and where step (11) of claim 4 wherein the indicated condition is displayed.

* * * * *